United States Patent
Mannhart et al.

(10) Patent No.: US 6,898,481 B2
(45) Date of Patent: May 24, 2005

(54) APPARATUS FOR MOUNTING SEMICONDUCTOR CHIPS

(75) Inventors: Eugen Mannhart, Cham (CH); Reto Schubiger, Ebikon (CH)

(73) Assignee: ESEC Trading SA, Cham (CH)

( * ) Notice: Subject to any disclaimer, the term of this patent is extended or adjusted under 35 U.S.C. 154(b) by 47 days.

(21) Appl. No.: 10/389,722

(22) Filed: Mar. 13, 2003

(65) Prior Publication Data

US 2003/0188407 A1 Oct. 9, 2003

(30) Foreign Application Priority Data

Mar. 28, 2002 (CH) .............................................. 0548/02

(51) Int. Cl.⁷ ................................................. G06F 7/00
(52) U.S. Cl. ..................................................... 700/213
(58) Field of Search ................................ 700/213, 214, 700/110, 121, 123; 414/935, 937, 941

(56) References Cited

U.S. PATENT DOCUMENTS

| | | | |
|---|---|---|---|
| 4,302,721 A | * 11/1981 | Urbanek et al. | ............. 324/226 |
| 4,851,902 A | 7/1989 | Tezuka et al. | ............. 358/101 |
| 5,208,464 A | 5/1993 | Yonemoto et al. | .......... 250/561 |
| 5,511,005 A | * 4/1996 | Abbe et al. | .................... 702/84 |
| 5,899,341 A | 5/1999 | Irita | |
| 5,926,742 A | 7/1999 | Thakur et al. | ............... 438/795 |

FOREIGN PATENT DOCUMENTS

| | | | |
|---|---|---|---|
| JP | 59-172731 | 9/1984 | ........... H01L/21/50 |
| JP | 7-137886 | 5/1995 | ............ B65H/7/12 |
| JP | 11-35152 | 2/1999 | ........... B65G/49/07 |
| WO | 01/89765 | 11/2001 | ........... B24B/37/04 |

* cited by examiner

*Primary Examiner*—Khoi H. Tran
(74) *Attorney, Agent, or Firm*—Thelen Reid & Priest LLP; David B. Ritchie

(57) ABSTRACT

An apparatus for mounting semiconductor chips comprises a loading station for the presentation of substrates, a first transport system and a second transport system. The first transport system removes one substrate after the other from the loading station and passes them on to the second transport system which transports the substrates in steps to a dispensing or soldering station and to a bonding station. A sensor with two coils arranged at a distance to one another is arranged in such a way that one end of the substrate transported by the first transport system travels through a gap formed between the two coils. The signal delivered by the sensor is used to determine a control signal which indicates whether or not the first transport system should pass the substrate on to the second transport system.

8 Claims, 2 Drawing Sheets

APPARATUS FOR MOUNTING SEMICONDUCTOR CHIPS

PRIORITY CLAIM

Figure 1:
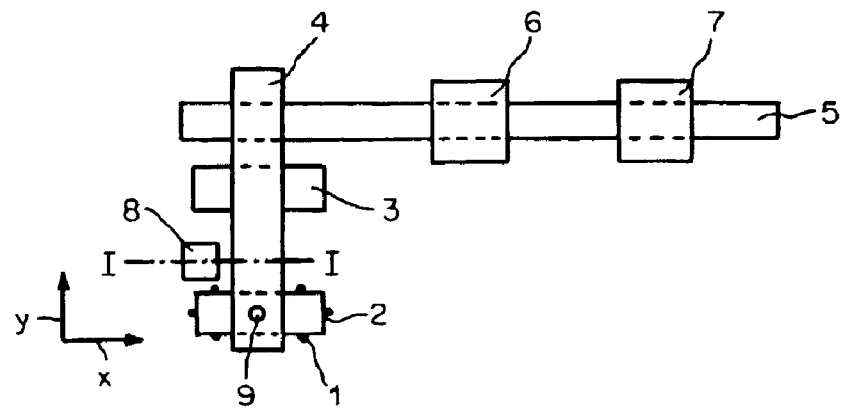

The present application claims priority under 35 U.S.C § 119 based upon Swiss Patent Application No. 2002 0548/02 filed on Mar. 28, 2002.

FIELD OF THE INVENTION

The invention concerns an apparatus for mounting semiconductor chips.

BACKGROUND OF THE INVENTION

With many applications, semiconductor chips are mounted onto a metallic substrate, a so-called leadframe. In doing so, the leadframes are presented in magazines or in a stack from where they are removed by a robot and fed to a transport system of an automatic assembly machine, a so-called Die Bonder, which transports the leadframes one after the other to a dispensing station where adhesive or solder is applied and to a bonding station where the semiconductor chip is mounted.

When the leadframes are presented in a stack, it often happens that, on removal, two leadframes stick together so that instead of a single leadframe two leadframes are removed and passed on to the transport system. In order to detect such errors, the thickness is determined of the leadframe which is passed on to the transport system. This normally takes place in a mechanical way, as a rule by means of a sampling pin. When the measured thickness exceeds a predetermined maximum value this means that two leadframes have been removed. As a result, the robot is instructed to remove the leadframes from the transport system and to feed them to a trash container. This type of inspection has the disadvantage that the error is detected late. It takes time to remove two leadframes which are stuck together from the transport system and to supply a new leadframe, which reduces the throughput.

BRIEF DESCRIPTION OF THE INVENTION

The object of the invention is to improve the removal and inspection of the leadframes.

In accordance with the invention, an inductive sensor is used for determining the thickness of the removed substrates or substrate. In doing so, the invention makes use of the inductive distance measurement with which the ohmic resistance and/or the inductance of a coil to which alternating current is applied changes when a metallic object is moved in its magnetic proximity. With the invention, the sensor comprises two coils arranged at a distance. The thickness of the removed substrates or substrate is measured immediately on removal from the loading station. In doing so, one end of the substrate is moved through the gap formed between the two coils. Flat coils are preferably used for the coils which measure the distance averaged over their area to the surface of the substrate facing towards the flat coil. The two coils are either operated independently of each other whereby each coil serves simultaneously as excitation as well as receiving coil. The signals from both coils are then added and the common signal evaluated. Or the two coils are connected electrically in series. In this case only one single signal is created which is then further processed and evaluated. In the event that the evaluation results in that only one single substrate has been picked up, the substrate is passed on to a transport system which transports the substrate in steps to a dispensing or soldering station where adhesive or solder is applied and to a bonding station where the semiconductor chip is mounted. In the event that the evaluation results in that more than one substrate has been picked up, then the substrates are passed on to a trash container.

A high frequency alternating current is applied to each individual flat coil which therefore produces a high frequency magnetic field. The frequency f of the alternating current is selected so high that the penetration depth of the magnetic field in the facing metallic surface of the substrate is clearly less than the thickness of the substrate. The penetration depth $\delta$ is given by the skin effect and can be calculated in accordance with the equation $$\delta \approx \sqrt{\frac{1}{\pi \mu \sigma f}}$$

whereby $\mu$ designates the magnetic permeability and $\alpha$ the electrical conductibility of the metallic surface. A high frequency f imposes itself for electrotechnical reasons: Because, as a rule, the inductivity L of the flat coil is very low and the flat coil together with a capacitor forms an oscillating circuit, a reasonable value for the capacity C of the capacitor is only achieved when the resonance frequency of the oscillating circuit is very high. In practice, a frequency f in the region of 10 MHz has proven itself. The output signal of the flat coil is, for example, the resonance frequency of the oscillating circuit formed by the flat coil and a capacitor or the amplitude of the alternating voltage applied to the flat coil or the phase shift of the alternating voltage applied to the flat coil or another signal derived directly from the flat coil. On the one hand, the flat coil therefore serves the production of a magnetic alternating field as well as the acquisition of the effect exerted on the magnetic field by the surface of the substrate facing towards the flat coil.

If the two coils are connected electrically in series and operated together like a single coil only one single output signal is created because with this embodiment the "formation of the sum" results from the connection of the two coils in series.

The invention can also be utilised in order to simplify the conversion of a Die Bonder for a new product. The Die Bonder then communicates with a database with data records each of which denotes a product to be processed on the Die Bonder. Each data record has characteristic data which characterise the substrate belonging to the product whereby these data are acquired during a learning phase by means of the sensor. Furthermore, each data record has machine parameters which have to be set for processing the product. On changeover from one product to a new product for which a data record already exists in the database, the Die Bonder is now set to an initialisation mode in order a) to acquire the characteristic data for the substrate belonging to the new product by means of the sensor,
b) to establish the data record the characteristic data of which correspond to the characteristic data determined for the substrate which has just been measured, and
c) to load the machine parameters for the data record established.

The production can now be started.

BRIEF DESCRIPTION OF THE DRAWING FIGURES

Figure 2:
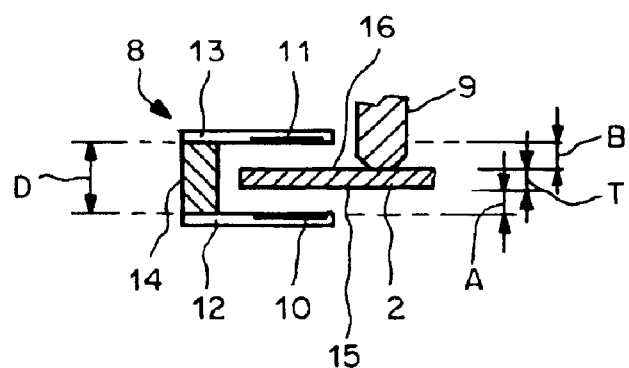
Figure 3:
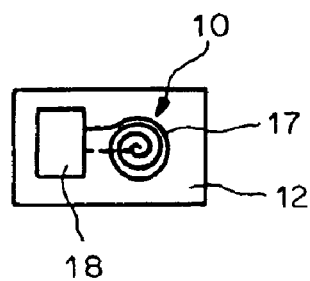
Figure 4:
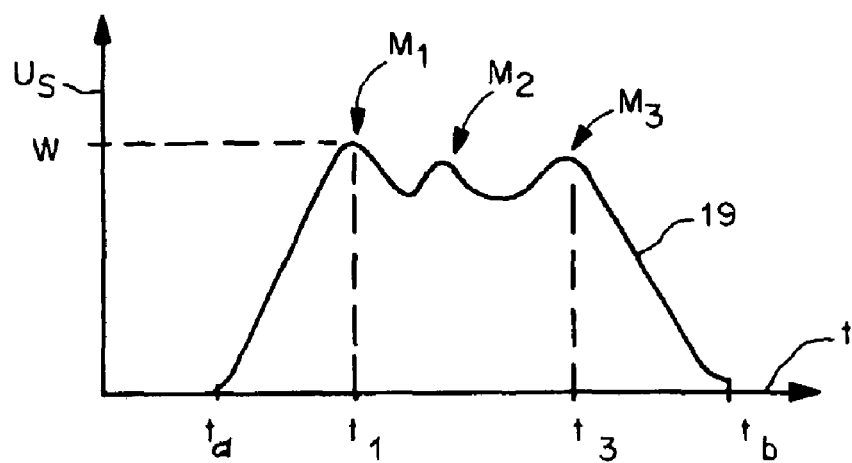
Figure 5:
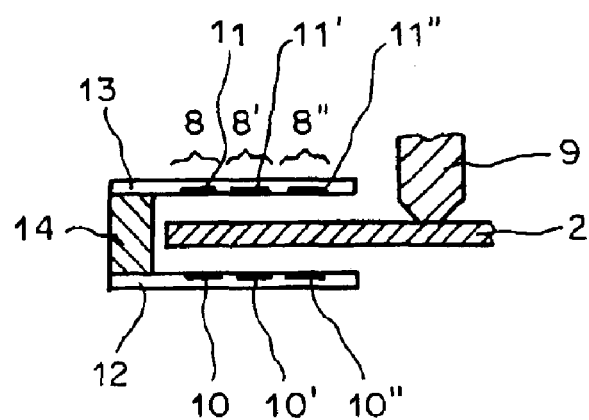

The accompanying drawings, which are incorporated into and constitute a part of this specification, illustrate one or FIG. 1 shows an apparatus for mounting semiconductor chips with a sensor according to the invention, FIG. 2 shows a section of the sensor along the line I—I of FIG. 1, FIG. 3 shows a coil of the sensor, FIG. 4 shows the progression of the signal of the sensor, and FIG. 5 shows an example with several sensors.

FIG. 1 shows schematically a plan view of an apparatus for mounting semiconductor chips, a so-called Die Bonder, as far as is necessary for understanding the invention. The Die Bonder comprises a loading station 1 where substrates 2 to be equipped with semiconductor chips are presented. In the example, the substrates 2 are stacked one on top of the other. In addition, the Die Bonder comprises a trash container 3, a first and a second transport system 4 and 5, a dispensing or soldering station 6, a bonding station 7 as well as a sensor 8 for determining the number of substrates 2 removed from the loading station 1. The first transport system 4 has a gripper 9 moveable backwards and forwards in a y direction which removes one substrate 2 after the other from the loading station 1, transports them in y direction past the sensor 8 and passes them on to either the trash container 3 or the second transport system 5. The second transport system 5 transports the substrates 2 in steps to the dispensing or soldering station 6 where a portion of adhesive or solder is applied and to the bonding station 7 where a semiconductor chip is bonded in a.

FIG. 2 shows a section of the sensor 8 along the line I—I of FIG. 1. The sensor 8 has two coils 10 and 11 arranged at a distance D to one another. The coils 10 and 11 are preferably flat coils formed from printed conductors on conventional printed circuit boards 12 or 13. The printed circuit boards 12 and 13 are separated by a spacer 14. On transport from the loading station 1 (FIG. 1) to the second transport system 5, one end of the substrate 2 passes through the gap existing between the two coils 10 and 11. The first coil 10 measures the distance A from the coil 10 to the underneath 15 of the substrate 2. The second coil 11 measures the distance B from the coil 11 to the upper surface 16 of the substrate 2. The thickness T of the substrate 2 then results in:

$$T=D-A-B=D-(A+B).$$

FIG. 3 shows a plan view of the coil 10 of the sensor 8. A spiral-shaped printed conductor 17 forms the windings of the coil 10 formed as a flat coil. The diameter of the coil 10 amounts typically to around 1 to 2 cm. The windings of the flat coil can however be of any other shape, eg, rectangular shaped or triangular shaped. The printed circuit board 12 also contains an electronic circuit 18 to operate the coil 10 and to evaluate the measuring signal delivered by the coil 10. Operation of such a coil 10 for producing a signal which is proportional to the distance from the coil to a metallic surface is known and has already been explained above. Analogously, the second printed circuit board 13 (FIG. 2) contains an electronic circuit for operating the coil 11. In the following, the measuring signal received from the first coil 10, is designated as $U_A$, the measuring signal received from the second coil 11 is designated as $U_B$.

Metallic substrates, so-called leadframes, as well as substrates 2 made of plastic, eg so-called BGA's®, are used as substrates 2. The plastic substrates contain metallic structures on the underneath as well as on their upper surface. Leadframes are also structured. The shape of the structures influences the measuring signals $U_A$ and $U_B$ of the two coils 10 and 11. As the diameter of the coils 10, 11 is appreciably larger than the lines and surfaces formed by the metallic structures, the two coils 10, 11 do not directly measure the distance A to the underneath 15 of the substrate 2 or the distance B to the upper surface 16 of the substrate 2. Nevertheless, various information can be extracted from the two measuring signals $U_A$ and $U_B$.

During transport, the end of the substrate 2 protruding into the gap of the sensor 8 can wobble so that the distances A and B also "wobble". However, the sum of the distances A+B remains constant. It is therefore advantageous to add the two measuring signals $U_A$ and $U_B$ to make one signal $U_S = U_A + U_B$.

With an extended line 19, FIG. 4 shows the progression of the signal $U_S$, as is typically the case, when the end of the substrate 2 is transported past the two coils 10 and 11 as is presented in FIG. 2. The signal $U_S$ has several local maximums which are separated by local minimums. In the example, there are three local maximums $M_1$, $M_2$ and $M_3$. The maximum $M_1$ is greater than the two other maximums $M_2$ and $M_3$ and is therefore a global maximum. When two substrates stick together and are transported together through the sensor 8, then the signal $U_S$ changes.

In a learning phase, one single substrate 2 is transported through the sensor 8 and a reference value $W_{Ref}$ is determined from the signal $U_S$. In production operation of the Die Bonder, a value W is determined in the same way from the signal $U_S$. A control signal is determined from the absolute amount of the difference $|W-W_{Ref}|$ which indicates whether or not the first transport system or the gripper 9 should pass the picked substrate 2 to the second transport system 5. If the amount $|W-W_{Ref}|$ is less than a predetermined tolerance value R, then this means that the gripper 9 has only picked up one substrate 2. The gripper 9 is then instructed to pass the substrate 2 on to the second transport system 5. If, however, the amount $|W-W_{Ref}|$ is greater than the tolerance value R, then this means that the gripper 9 has picked up more than one substrate 2. The gripper 9 is therefore instructed to pass the picked substrates 2 to the trash container 3. In the following, two examples are given as to how the desired information can be extracted from the signal $U_S$.

Example 1

The value of the global maximum $M_1$ is determined as the value W. This is presented in FIG. 4.

Example 2

The signal $U_S(t)$ integrated over time t serves as the value W:

$$W = \int_{t_a}^{t_b} U_S(t)\,dt, \qquad (1)$$

whereby the points in time $t_a$ and $t_b$ designate the entry of the substrate 2 into the sensitivity range and the exit out of the sensitivity range of the sensor 8.

When the substrate 2 is not symmetrical in relation to its longitudinal axis, then the progression of the signal $U_S$ is also not symmetrical. With a further analysis of the signal $U_S$ it can therefore be determined whether the substrates 2 in the loading station 1 are presented in the correct orientation. In the example in FIG. 4, the global maximum $M_1$ occurs at point in time $t_1$ before the local maximum $M_3$ at point in time $t_3$. Therefore, if, on evaluating the signal $U_S$ it is determined that the local maximum $M_3$ occurs before the global maximum $M_1$, ie, that $t_3 < t_1$ is, then this means that the substrates 2 have been presented in a wrong position in the loading station 1. As a result, the production operation of the Die Bonder is stopped and an alarm is produced with a corresponding message.

In production it can also happen that substrates of a different type have been mistakenly presented in the loading station 1. With the sensor 8, this can be detected. When the amount $|W-W_{Ref}|$ is greater than the tolerance value R, then in comparison to the example described above, this would be interpreted that the gripper 9 had picked up more than one substrate. However, the analysis can be further refined in various ways:

A) When successive measurements, for example two or three measurements, result in the amount $|W-W_{Ref}|$ being greater than the tolerance value R, then this can also mean that not two substrates 2 have been picked up but that mistakenly substrates of a different type have been presented in the loading station 1. As a result, the production operation of the Die Bonder is stopped and an alarm is produced with a corresponding message.

B) When the amount $|W-W_{Ref}|$ is greater than a second tolerance value $R_2$, whereby the tolerance value $R_2$ is greater than the tolerance value R, then this is interpreted that substrates of a different type have been mistakenly presented at the loading station 1. As a result, the production operation of the Die Bonder is stopped and an alarm is produced with a corresponding message.

C) When the amount $|W-W_{Ref}|$ is greater than the tolerance value R, then, under certain circumstances it can also be deduced from the sign of the difference $W-W_{Ref}$, whether substrates of a wrong type have been presented.

In the following, a further development of the invention is also explained with which the signal $U_S(t)$ delivered by the sensor 8 is used in order to automatically set up the Die Bonder for a new product when changing over to a different product. For this purpose, the Die Bonder has a database in which on the one hand the machine parameters to be set up for production of the product and, on the other hand, data which characterise the substrate belonging to the product are stored. These characteristic data are gained from the signal $U_S(t)$ delivered by the sensor 8. Examples of such characteristic data are:

the progression of the signal $U_S(t)$, and/or at least one value derived from the signal $U_S(t)$ such as, eg, the value of the global maximum $M_1$ or the value of the integral according to equation (1), or the value of the local maximum $M_2$, etc.

When a product P is to be processed on the Die Bonder for the first time, then, in a learning mode, one substrate 2 belonging to this product P is transported from the first transport system 4 as described above through the gap between the coils 10 and 11 of the sensor 8. Afterwards, the characteristic data are determined from the signal $U_S(t)$ delivered by the sensor 8. Furthermore the machine parameters necessary for processing the product P are determined. All this data is saved in the database as a new data record belonging to product P.

When production is converted to a different product $P_2$ which has already been produced on the Die Bonder, then the data record stored in the database can be used in order to automatically set up the Die Bonder for the product $P_2$. This is done in an initialisation mode in which a substrate belonging to this product $P_2$ is transported from the first transport system 4 through the sensor 8 and then the characteristic data determined from the sensor signal $U_S(t)$. That data record in the database is then established the characteristic data of which correspond to the characteristic data determined for the substrate 2 which has just been transported. This data record contains all machine parameters necessary for the processing of the product $P_2$ belonging to the measured substrate. The Die Bonder now loads these machine parameters and, in doing so, is set up for the new product P2 to be produced so that the switch can now be made from the initialisation mode into production mode and production can be started.

In order that all these tasks can be carried out reliably, under certain circumstances it can be advantageous to reduce the dimensions of the sensor 8. The smaller the dimensions of the sensor, the greater its spatial resolution. The greater the spatial resolution is, the more likely is the reliable detection of relatively small structural differences between different types of substrate.

A further possibility exists in that, as is shown in FIG. 5, several relatively small sensors 8 also comprising two coils each are used which are arranged next to each other at right angles to the transport direction of the first transport system 4. Each of these sensors 8 then covers a different area of the substrate 2. In the example, three sensors 8, 8' and 8" are presented. The corresponding coils are designated with the reference numerals 10, 10' and 10" or 11, 11' and 11".

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

What is claimed is:

1. An apparatus for mounting semiconductor chips, comprising
   a loading station for presenting substrates,
   a first and a second transport system, the first transport system for removing one substrate after the other out of the loading station and passing the removed substrate on to the second transport system and the second transport system for transporting the substrates in steps to a dispensing or soldering station, where a portion of adhesive or solder is applied, and to a bonding station where a semiconductor chip is mounted, and
   a sensor comprising two coils arranged at a distance to each other, the sensor arranged in such a way that an end of the substrate travels through a gap formed between the two coils when transported by the first transport system, the apparatus adapted to form from an output signal of the sensor a control signal indicating whether or not the first transport system should pass the substrate on to the second transport system.

2. The apparatus according to claim 1, the apparatus adapted to determine an information from the progression of the signal of the sensor which indicates whether the substrates are presented in the correct orientation in the loading station.

3. The apparatus according to claim 1, the apparatus communicating with a database with data records, each of which designates one product to be processed on the apparatus, wherein each data record comprises characteristic data which characterise the substrate belonging to the product, whereby these characteristic data are acquired in a learning phase by means of the sensor, wherein each data record further comprises machine parameters which are to be set up for the processing of the product, and wherein, on changing over from one product to a new product for which a data record already exists in the database, the apparatus adapted in an initialisation mode to acquire the characteristic data for the substrate belonging to the new product by means of the sensor, to establish that data record the characteristic data of which correspond to the characteristic data determined for the substrate which has just been measured, and to load the machine parameters of the data record established.

4. The apparatus according to claim 2, the apparatus communicating with a database with data records, each of which designates one product to be processed on the apparatus, wherein each data record comprises characteristic data which characterise the substrate belonging to the product, whereby these characteristic data are acquired in a learning phase by means of the sensor, wherein each data record further comprises machine parameters which are to be set up for the processing of the product, and wherein, on changing over from one product to a new product for which a data record already exists in the database, the apparatus adapted in an initialisation mode to acquire the characteristic data for the substrate belonging to the new product by means of the sensor, to establish that data record the characteristic data of which correspond to the characteristic data determined for the substrate which has just been measured, and to load the machine parameters of the data record established.

5. An apparatus for mounting semiconductor chips, comprising a loading station for presenting substrates, a first and a second transport system, the first transport system for removing one substrate after the other out of the loading station and passing the removed substrate on to the second transport system and the second transport system for transporting the substrates in steps to a bonding station where a semiconductor chip is mounted, and a sensor comprising two coils arranged at a distance to each other, the sensor arranged in such a way that an end of the substrate travels through a gap formed between the two coils when transported by the first transport system, the apparatus adapted to form from an output signal of the sensor a control signal indicating whether or not the first transport system should pass the substrate on to the second transport system.

6. The apparatus according to claim 5, the apparatus adapted to determine an information from the progression of the signal of the sensor which indicates whether the substrates are presented in the correct orientation in the loading station.

7. The apparatus according to claim 5, the apparatus communicating with a database with data records, each of which designates one product to be processed on the apparatus, wherein each data record comprises characteristic data which characterise the substrate belonging to the product, whereby these characteristic data are acquired in a learning phase by means of the sensor, wherein each data record further comprises machine parameters which are to be set up for the processing of the product, and wherein, on changing over from one product to a new product for which a data record already exists in the database, the apparatus adapted in an initialisation mode to acquire the characteristic data for the substrate belonging to the new product by means of the sensor, to establish that data record the characteristic data of which correspond to the characteristic data determined for the substrate which has just been measured, and to load the machine parameters of the data record established.

8. The apparatus according to claim 6, the apparatus communicating with a database with data records, each of which designates one product to be processed on the apparatus, wherein each data record comprises characteristic data which characterise the substrate belonging to the product, whereby these characteristic data are acquired in a learning phase by means of the sensor, wherein each data record further comprises machine parameters which are to be set up for the processing of the product, and wherein, on changing over from one product to a new product for which a data record already exists in the database, the apparatus adapted in an initialisation mode to acquire the characteristic data for the substrate belonging to the new product by means of the sensor, to establish that data record the characteristic data of which correspond to the characteristic data determined for the substrate which has just been measured, and to load the machine parameters of the data record established.

* * * * *